(12) United States Patent
Palla

(10) Patent No.: US 7,344,900 B2
(45) Date of Patent: Mar. 18, 2008

(54) LASER SCRIBE ON FRONT SIDE OF SEMICONDUCTOR WAFER

(75) Inventor: Byron Joseph Palla, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 535 days.

(21) Appl. No.: 10/361,933

(22) Filed: Feb. 10, 2003

(65) Prior Publication Data

US 2004/0211750 A1    Oct. 28, 2004

(51) Int. Cl.
*G01R 31/26* (2006.01)
*H01L 21/66* (2006.01)

(52) U.S. Cl. ............ 438/16; 438/7; 257/E21.237; 428/209; 428/69; 216/4

(58) Field of Classification Search ............ 438/462, 438/7, 16; 257/E21.237; 428/209, 69; 216/4
See application file for complete search history.

(56) References Cited

U.S. PATENT DOCUMENTS 4,825,093 A * 4/1989 Kiriseko et al. ............ 250/566
5,777,743 A * 7/1998 Bacchi et al. ............ 356/370
2002/0031899 A1 * 3/2002 Manor ................... 438/460

\* cited by examiner

*Primary Examiner*—Michelle Estrada
*Assistant Examiner*—Jarret J Stark
(74) *Attorney, Agent, or Firm*—Jacqueline J. Garner; W. James Brady, III; Frederick J. Telecky, Jr.

(57) ABSTRACT

Disclosed are a semiconductor wafer (10) having a front side laser scribe (22) and the methods for manufacturing the same. The methods of the invention include the formation of a scribe foundation (12) on the front side of the semiconductor wafer (10) designed to accept laser scribing (22), and laser scribing the scribe foundation (12). Disclosed embodiments include a semiconductor wafer (10) having a scribe foundation (12) of layered dielectric (30) and metal (34) on the front side. According to disclosed embodiments of the invention, the formation of a scribe foundation (12) is performed in combination with the formation of a top level metal layer (34) on the semiconductor wafer (10) methods for manufacturing.

10 Claims, 4 Drawing Sheets

LASER SCRIBE ON FRONT SIDE OF SEMICONDUCTOR WAFER

TECHNICAL FIELD

The invention relates to semiconductor device manufacturing. More particularly, the invention relates to semiconductor wafer processing and to methods for making a trackable laser scribe on the front side of a semiconductor wafer.

BACKGROUND OF THE INVENTION

Semiconductor device fabrication requires that a semiconductor wafer pass through a number of manufacturing stages. For example, masking, patterning, etching, and film deposition may be performed numerous times in order to manufacture the multiple layers and features of a semiconductor device. The need to track individual wafers through the manufacturing process has given rise to the use of a trackable wafer scribe, typically in the form of a numerical designation readable by both human operators and machines.

Scribing a semiconductor at the beginning of the manufacturing process allows the wafer to be tracked through the remainder of the processing steps. Several problems arise, however with scribing a wafer at the beginning of the manufacturing process. For example, particles and contaminants can collect in the scribed area during a deposition step, then spread to other areas of the wafer during subsequent processing steps. The result is often the formation of unwanted short-circuits, open circuits, and other defects in the completed devices. A common approach to solving these problems is the use of a scribe on the backside of the wafer only, rather than the front side. In fact, it is common for manufacturers of larger semiconductor wafers, e.g. 300 mm, to place scribes exclusively on the backside, rather than on the front as used with 200 mm wafers.

The use of a backside wafer scribe avoids many of the problems associated with the presence of a front side scribe during some manufacturing steps, particularly those performed in the early stages of wafer fabrication, however the utility of backside scribes is limited. One of the primary limitations of the use of backside wafer scribes is that some steps in the wafer fabrication process can operate to eliminate or obscure the scribe. Backside scribes are particularly susceptible to damage or eradication during steps near the end of the wafer fabrication process. For example, following steps for passivation and bond pad formation, further steps are typically performed in preparation for eventual die separation and packaging, including backgrind, resulting in the removal of the scribe. An additional problem encountered is that some testing and packaging equipment is designed for use with wafers having a front side scribe, and upgrading such equipment to read backside scribes can be quite costly.

Due to these and other problems, the application of a front side scribe as late in the wafer fabrication process as possible, but prior to process steps which may interfere with the use of the backside scribe, would be desirable in the arts. Such a front side scribe would permit continuity in tracking wafers until die separation. However, conventional scribing methods are not amenable to scribing the front side of a wafer in the advanced stages of the fabrication process. This is due to the characteristics and materials present on the wafer as it nears completion. For example, the films present on the wafer front side may include dielectrics, metals, and etch-stop materials. As a result, the wafer surface may have inherent variability in thickness and composition, which may be particularly extreme at the edges of the wafer outside of the boundaries of the saleable devices. This variability extends not only to the surface of the individual wafer, but also to variations from wafer to wafer and from lot to lot. This is particularly true at the wafer edge where the front side scribe is commonly applied. The use of typical laser scribing equipment on such surfaces often results in variations in depth, profile and ultimately in readability of the scribe and may also cause contamination of the wafer surface.

Improved front side semiconductor wafer scribes and scribing methods would be useful and advantageous in the arts. Such scribes and methods would provide increased readability for front side scribes useful for wafer tracking during processing while mitigating contamination and reducing cost.

SUMMARY OF THE INVENTION

In carrying out the principles of the present invention, in accordance with an embodiment thereof, a method for manufacturing a semiconductor wafer having a front side laser scribe includes forming a scribe foundation on the front surface of the semiconductor wafer and laser scribing the scribe foundation.

According to one aspect of the invention, the method for manufacturing a semiconductor wafer has scribe foundation forming steps including depositing and etching at least one dielectric layer on the front side of the semiconductor wafer followed by depositing and etching at least one metallic layer on the dielectric layer. According to another step of the invention, the scribe foundation thus formed on the front surface of the semiconductor wafer is laser scribed with a trackable scribe.

According to another aspect of the invention, a step of depositing at least one metallic layer to form a scribe foundation on the front side of a semiconductor wafer is performed in combination with a step of forming a top level metal layer on the semiconductor wafer.

According to another aspect of the invention, an exemplary embodiment includes a semiconductor wafer having a front side laser scribe on a scribe foundation. The scribe has a plurality of scribe marks less than approximately 2 micrometers in depth.

According to yet another aspect of the invention, an example is described in which the front side laser scribe includes a number of scribe marks approximately 50 micrometers to approximately 100 micrometers in diameter.

The invention provides technical advantages including but not limited to providing a semiconductor wafer with a trackable front side scribe with increased readability. Further technical advantages include cost savings, compatibility with semiconductor wafer processing techniques and equipment, and reduced risk of contamination of the semiconductor wafer during processing. These and other features, advantages, and benefits of the present invention will become apparent to one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 2A depicts a partial cross section view of an example of a semiconductor wafer with a passivation layer applied;

FIG. 2B illustrates a partial cross section view of an example of a semiconductor wafer with an etched passivation layer;

FIG. 2C shows a partial cross section view of an example of a semiconductor wafer with a metal layer applied to the etched passivation layer;

FIG. 2D is a partial cross section view of an example of a semiconductor wafer with an etched metallic layer on an etched passivation layer to form a scribe foundation;

References in the detailed description correspond to like references in the figures unless otherwise noted. Like numerals refer to like parts throughout the various figures. Descriptive and directional terms used in the written description such as upper, lower, left, right, etc., refer to the drawings themselves as laid out on the paper and not to physical limitations of the invention unless specifically noted. The drawings are not to scale, and some features of embodiments shown and discussed are simplified or exaggerated for illustrating the principles, features, and advantages of the invention.

DETAILED DESCRIPTION OF PREFERRED EMBODIMENTS

Figure 1A:
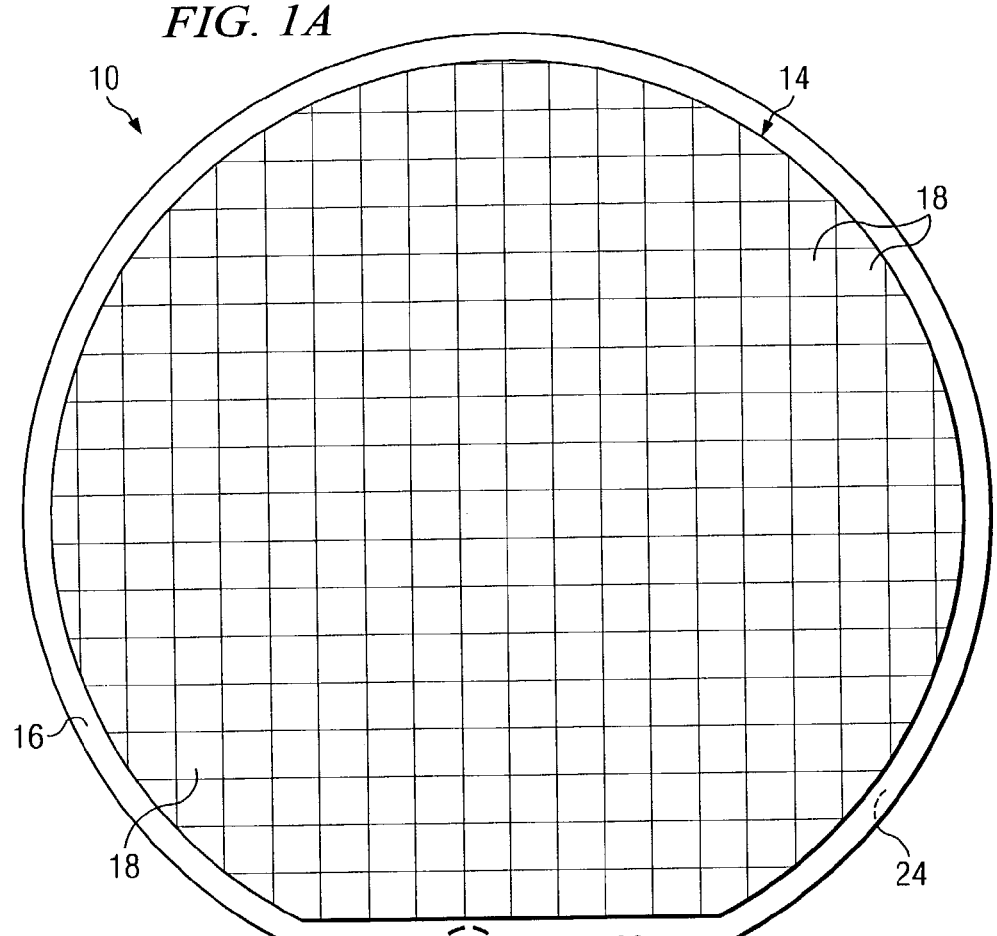
FIG. 1A is a top view of an example of a preferred embodiment of a front side laser wafer scribe according to the invention.
Figure 1B:
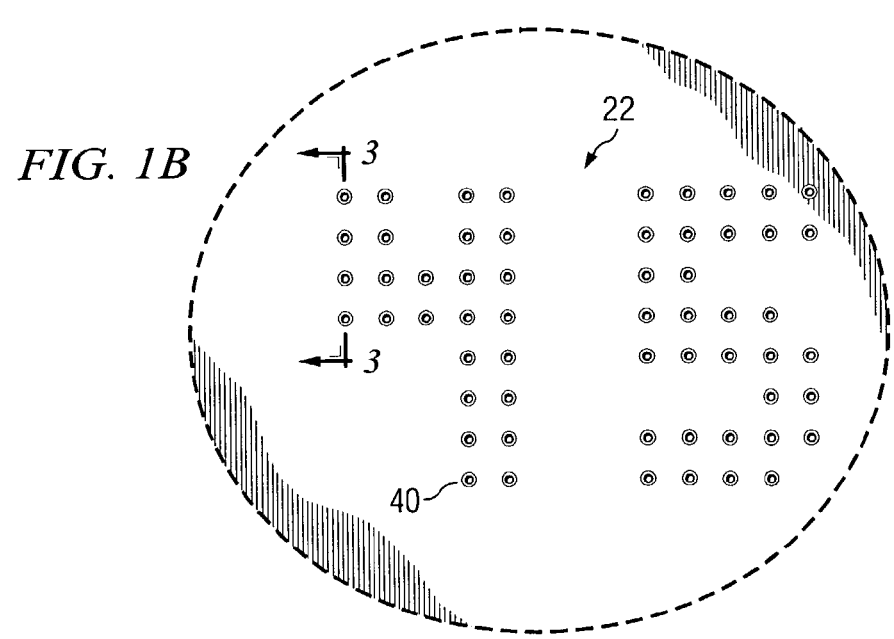
FIG. 1B is a close-up partial top view of the example of a preferred embodiment of a front side laser wafer scribe of FIG. 1A.

In general, the invention provides a semiconductor wafer having an integrated scribe foundation on the front side, facilitating the application of a trackable laser scribe on the front side of the wafer. A wafer 10 is shown in FIG. 1A illustrating an example of a preferred embodiment of the invention. A scribe foundation 12 is incorporated into the front side 14 of the wafer 10. The scribe foundation 12 is preferably located at the edge 16 of the wafer 10 in order to maximize compatibility with wafer processing equipment known in the arts and to minimize interference with semiconductor device dice 18 present on the wafer 10. The scribe foundation 12 shown in the example of FIG. 1A is located at a notch 20 typically provided for use in orienting and handling the wafer 10 during processing. Other scribe foundation locations may be used without departure from the invention. A laser scribe 22 is shown on the scribe foundation 12. The scribe 22 preferably has numerous individual scribe marks 40 made using conventional laser scribing equipment. It should be appreciated that the invention may be used at any suitable stage of wafer processing irrespective of whether a backside scribe is present on the backside 24 of the wafer 10. A close-up partial top view of a portion of the scribe 22 is further illustrated in FIG. 1B.

Figure 2A:
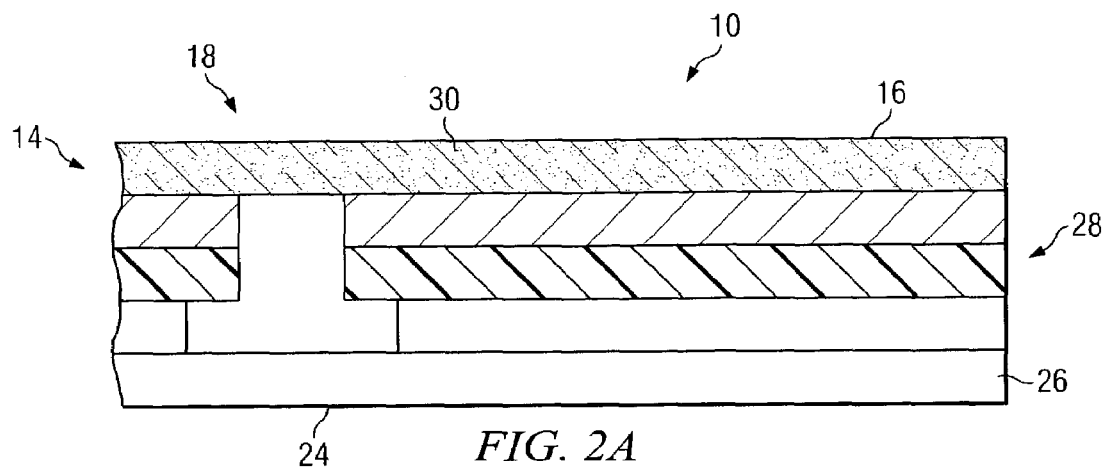
FIGS. 2A through 2D illustrate examples of steps in scribing a semiconductor wafer according to a preferred embodiment of the invention.

Now referring primarily to FIGS. 2A through 2D, examples of steps used in methods for manufacturing a semiconductor wafer with a front side laser scribe according to the invention are shown and described. As can be seen in FIG. 2A, a wafer 10 has a substrate 26, typically sliced from a silicon crystal. Various layers 28 are applied according to common semiconductor processing techniques in order to produce the desired features of devices 18 on the wafer 10. Generally, a wafer has numerous semiconductor devices and multiple layers. For example, complex devices may have three or four or more metal layers with intervening dielectric layers. The exact configuration of the wafer 10 and number and composition of the layers 28 are not crucial to the implementation of the invention except as noted. The backside 24 of the wafer 10 is typically bare silicon. In advanced stages of the wafer fabrication process a protective dielectric layer, or passivation overcoat (PO) 30, is typically applied to protect the front side 14 of the wafer 10.

Figure 2B:
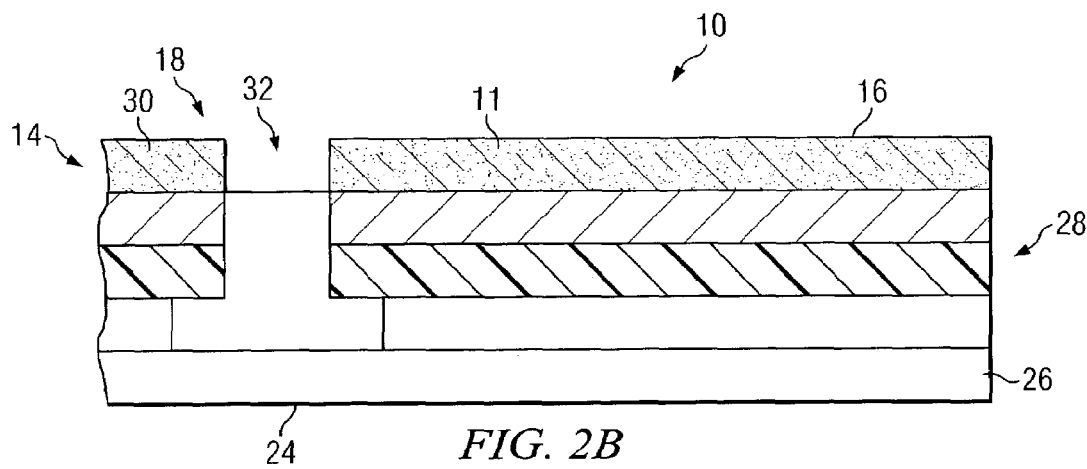

As shown in FIG. 2B, the passivation overcoat layer 30 is preferably patterned and etched to form desired features 32 according to the design of the devices 18 present on the wafer 10. A scribe foundation portion 11 of the passivation overcoat layer 30 is preserved, preferably at the edge 16 of the wafer 10.

Figure 2C:
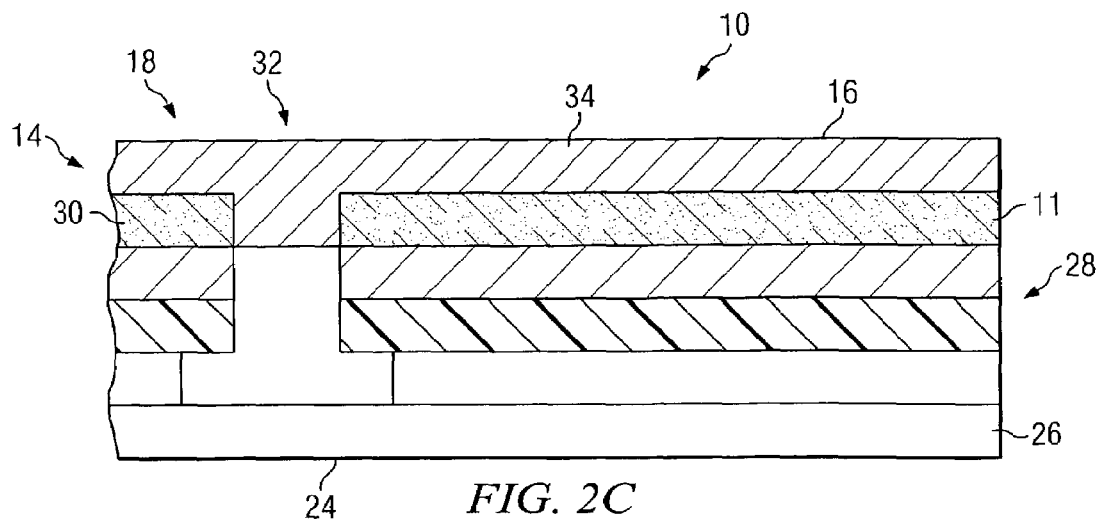

FIG. 2C shows the deposition of a top level metallic layer 34 on the upper surface of the etched passivation layer 30. Typically the metallic layer 34 is applied to a thickness of about 0.5 to 1.5 micrometers for the formation of bond pads in preparation for completion of the wafer 10. The metallic layer 34 material is generally chosen for its electrical conductivity under the constraints of cost and manufacturability characteristics. Generally metals such as aluminum or copper are selected, although other metals or alloys may be used.

Figure 2D:
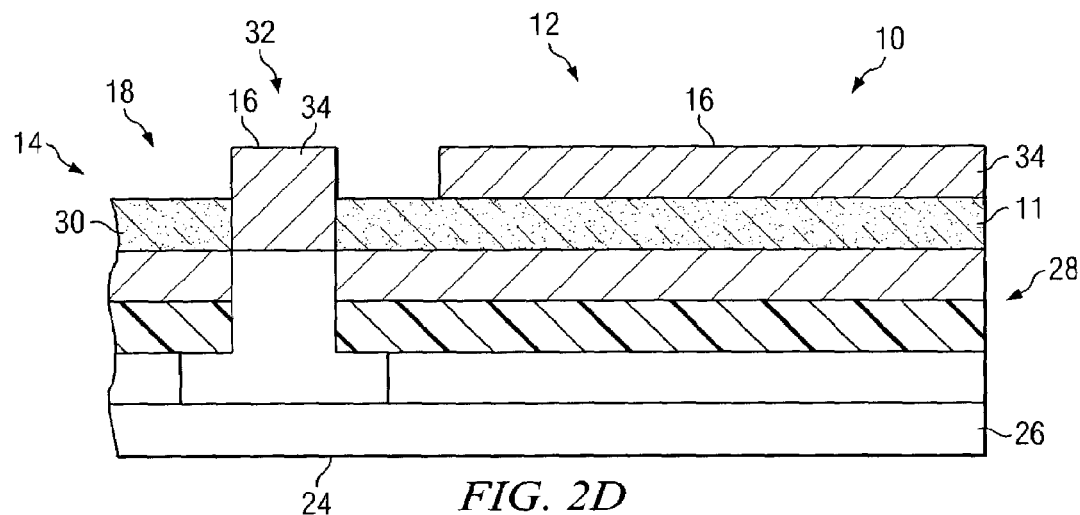

As illustrated in FIG. 2D, the metal layer 34 is patterned and etched as known in the arts to complete the formation of the designed features 32 of the semiconductor devices 18 such as bond pads. It should be understood that both a portion 11 of the passivation layer 30 and a corresponding portion of the metallic layer 34 are retained at the edge 16 of the wafer 10 throughout any subsequent masking and etching steps in order to form a scribe foundation 12.

Figure 3:
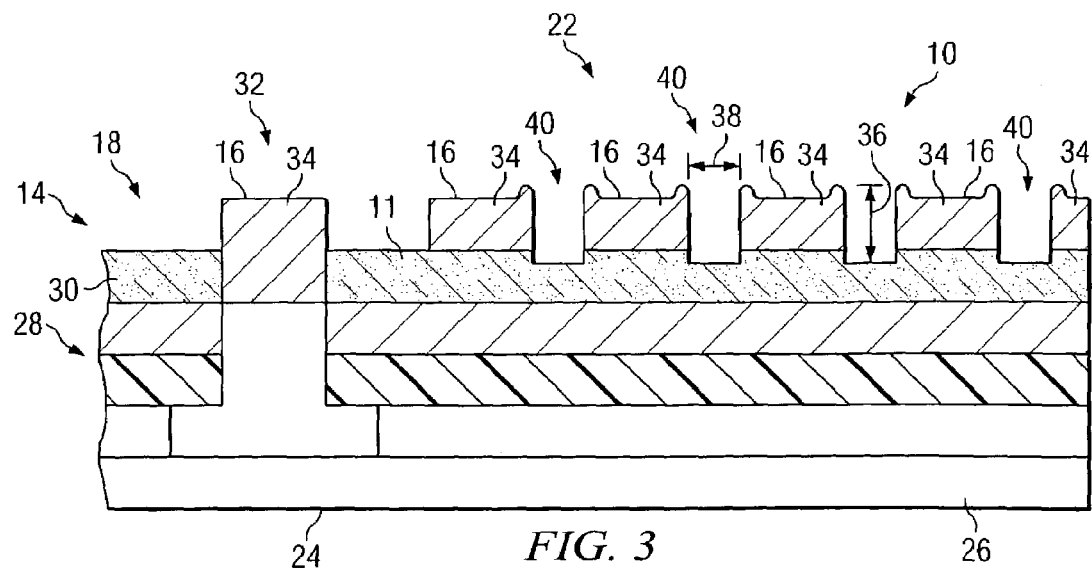
FIG. 3 is a partial cross section view of an exemplary embodiment of a semiconductor wafer with a front side scribe on a scribe foundation as illustrated in FIG. 1B, taken along line E-E.

Referring now primarily to FIG. 3, a scribe 22 is applied to the scribe foundation 12, preferably using laser scribe equipment known in the arts. The depth 36 of the scribe 22 is preferably shallow in order to avoid interference with underlying layers 28 and to minimize contamination by removed material. Preferably the depth 36 of the scribe 22 is less than approximately 2 micrometers. The width 38 of each of the individual marks 40 of the scribe 22 is preferably on the order of approximately 50 to 100 micrometers, more preferably about 50 micrometers.

Those skilled in the arts will recognize that the scribe foundation 12 may be formed in combination with the formation of other features during the wafer manufacturing process steps. The scribe foundation 12 provides a surface amenable to laser scribing for producing a scribe with good contrast and readability, while avoiding the production of excessive sources of particulate and metallic contamination. Of course, scribe foundations 12 may be formed of multiple metallic or dielectric layers of various materials without departure from the invention. It has been found that laser scribing equipment known in the arts may be used to produce consistent high-quality scribes with good machine-readability. Optical edge bead removal in conjunction with the patterning steps, as well as chemical edge bead removal in conjunction with the deposition steps, may also be used as required to prepare the scribe foundation 12 for scribing. Preferably, subsequent to scribing, the wafer 10 is further processed in steps such as testing, separation, and packaging. Of course many variations are possible and some of the steps shown and described may be performed simultaneously according to known methods of manufacture.

Figure 4:
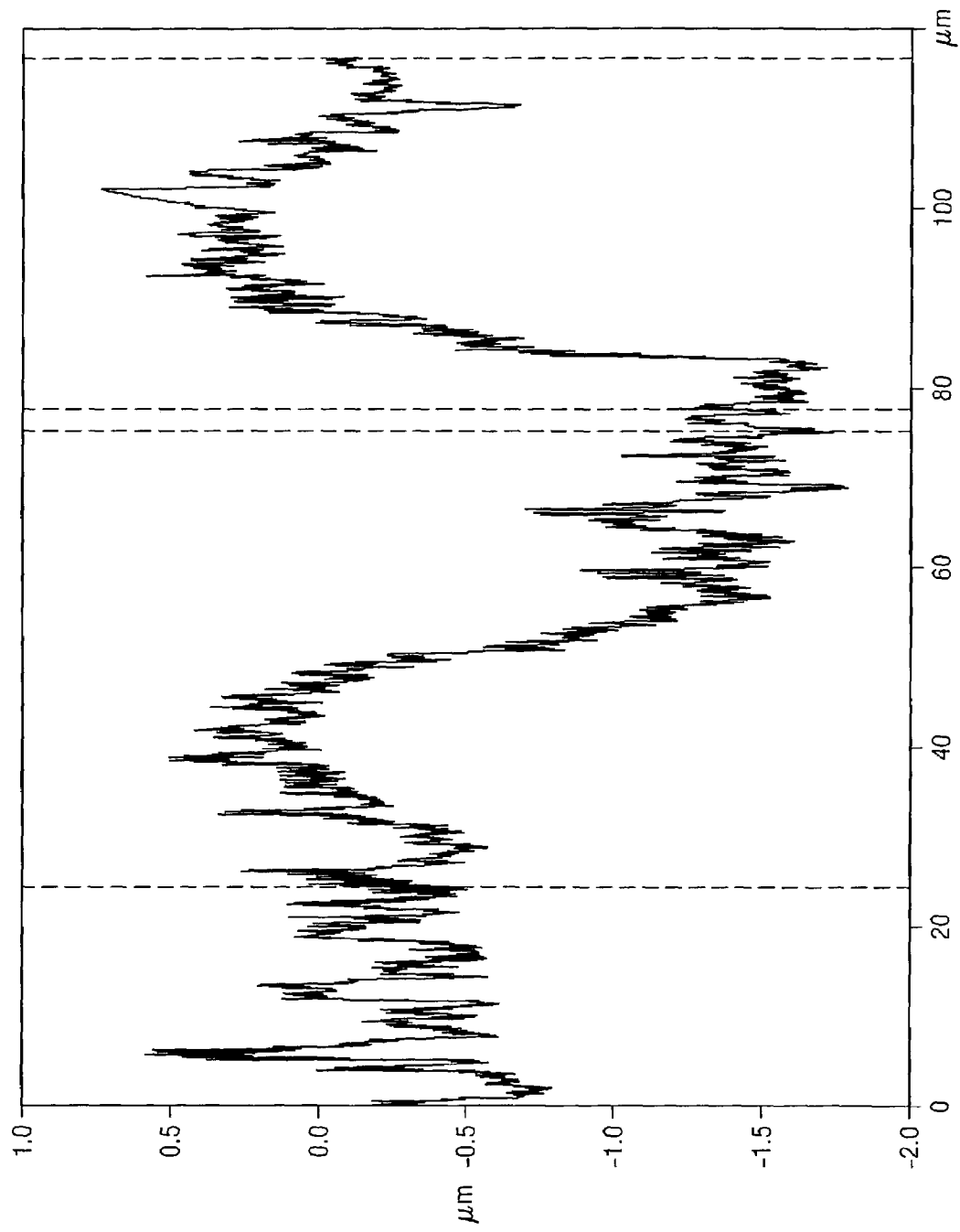
FIG. 4 is a graphical representation of an atomic force profilometer profile of a scribe mark formed in a scribe foundation according to the invention.

FIG. 4 is a graphical depiction of the profile of a laser scribe mark 40 made according to the invention. It can be seen that the scribe is approximately 50 micrometers wide by about 1.5 micrometers deep. These dimensions are merely examples of a configuration of front side scribe marks made possible by the use of the invention, and other scribe mark dimensions may be used.

Thus, the invention provides a semiconductor device wafer with a front side trackable scribe, and methods used in its manufacture. While the invention has been described with reference to certain illustrative embodiments, the description of the methods and devices described are not intended to be construed in a limiting sense. Various modifications and combinations of the illustrative embodiments as well as other advantages and embodiments of the invention will be apparent to persons skilled in the art upon reference to the description and claims.

I claim:

1. A method for manufacturing a semiconductor wafer comprising the steps of:
    forming underlying layers over a semiconductor wafer;
    depositing a passivation layer over said underlying layers;
    depositing a metal bond pad layer over the passivation layer;
    etching the metal bond pad layer to form bond pads, wherein a portion of the passivation layer and a portion of the metal bond pad layer form a scribe foundation; and
    laser scribing a trackable scribe in the metal bond pad layer, wherein said trackable scribe is shallower than a combined thickness of said metal bond pad layer and said passivation layer.

2. A method for manufacturing a semiconductor wafer comprising the steps of:
    forming underlying layers over a semiconductor wafer;
    depositing a passivation layer over said underlying layers;
    depositing a metal layer over the passivation layer;
    etching the metal layer to form bond pads, wherein a portion of the passivation layer and a portion of the metal layer form a scribe foundation; and
    laser scribing a trackable scribe in the metal layer, wherein said trackable scribe extends through said metal layer into said passivation layer and terminates within said passivation layer.

3. The method according to claim 1, wherein the step of forming a scribe foundation is performed at the edge of the wafer.

4. The method according to claim 1 wherein the scribing step further comprises scribing individual scribe marks of approximately 50 micrometers to approximately 100 micrometers in diameter.

5. The method according to claim 1 wherein the step of depositing at least one metallic layer comprises depositing aluminum.

6. The method according to claim 1 wherein the step of depositing at least one metallic layer comprises depositing copper.

7. The method according to claim 2, wherein the step of forming a scribe foundation is performed at the edge of the wafer.

8. The method according to claim 2 wherein the scribing step further comprises scribing individual scribe marks of approximately 50 micrometers to approximately 100 micrometers in diameter.

9. The method according to claim 2 wherein the step of depositing at least one metallic layer comprises depositing aluminum.

10. The method according to claim 2 wherein the step of depositing at least one metallic layer comprises depositing copper.

* * * * *